United States Patent
Kanada

(10) Patent No.: US 10,663,526 B2
(45) Date of Patent: May 26, 2020

(54) BATTERY MANAGEMENT TERMINAL AND BATTERY MANAGEMENT SYSTEM

(71) Applicant: TOYOTA JIDOSHA KABUSHIKI KAISHA, Toyota-shi, Aichi-ken (JP)

(72) Inventor: Ryo Kanada, Toyohashi (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 33 days.

(21) Appl. No.: 14/746,242

(22) Filed: Jun. 22, 2015

(65) Prior Publication Data
US 2015/0369867 A1    Dec. 24, 2015

(30) Foreign Application Priority Data
Jun. 24, 2014  (JP) ................. 2014-129088

(51) Int. Cl.
| | |
|---|---|
| *G01R 31/36* | (2020.01) |
| *G01R 31/3828* | (2019.01) |
| *H02J 7/00* | (2006.01) |
| *H01M 10/42* | (2006.01) |
(Continued)

(52) U.S. Cl.
CPC ......... *G01R 31/3828* (2019.01); *G01R 31/36* (2013.01); *G01R 31/367* (2019.01); *G01R 31/392* (2019.01); *H01M 10/4207* (2013.01); *H01M 10/4285* (2013.01); *H02J 7/007* (2013.01); *H02J 7/0047* (2013.01); *H02J 7/0063* (2013.01); *H02J 2007/0067* (2013.01)

(58) Field of Classification Search
CPC ............................. G01R 31/361; G01R 31/36
USPC ........................................................ 324/432
See application file for complete search history.

(56) References Cited

U.S. PATENT DOCUMENTS

| | | | | |
|---|---|---|---|---|
| 7,710,073 B2 * | 5/2010 | Yamauchi | ............. | H01M 10/42 320/128 |
| 8,907,674 B2 * | 12/2014 | Takahashi | .......... | G01R 31/3634 324/427 |
| 9,056,556 B1 * | 6/2015 | Hyde | ................. | B60L 11/1851 |

(Continued)

FOREIGN PATENT DOCUMENTS

| | | |
|---|---|---|
| JP | 2005-164604 A | 6/2005 |
| JP | 4494453 B2 | 4/2010 |

(Continued)

OTHER PUBLICATIONS

English Translation of communication dated Jul. 11, 2016 from the Korean Intellectual Property Office in counterpart application No. 10-2015-0088452.

*Primary Examiner* — Jerry D Robbins
(74) *Attorney, Agent, or Firm* — Sughrue Mion, PLLC

(57) ABSTRACT

A battery management terminal is for a secondary battery mounted on a device. The battery management terminal includes a second electronic control unit and an inform unit. The second electronic control unit is configured to, at the time when the secondary battery is replaced, acquire a historical information of an evaluation value of the secondary battery before replacement from the first electronic control unit. The second electronic control unit is configured to determine required characteristics required of a replacement secondary battery on the basis of the historical information of the evaluation value. The inform unit is configured to inform the required characteristics determined by the second electronic control unit.

7 Claims, 8 Drawing Sheets

(51) Int. Cl.
*G01R 31/392* (2019.01)
*G01R 31/367* (2019.01)

(56) References Cited

U.S. PATENT DOCUMENTS

| | | | |
|---|---|---|---|
| 2010/0241376 A1* | 9/2010 | Kikuchi | B60K 6/445 |
| | | | 702/63 |
| 2011/0270477 A1* | 11/2011 | Ueki | H01M 10/0525 |
| | | | 701/22 |
| 2012/0191578 A1 | 7/2012 | Katagishi et al. | |
| 2014/0046536 A1* | 2/2014 | Iguchi | G01R 31/3606 |
| | | | 701/34.4 |
| 2014/0159736 A1* | 6/2014 | Morimoto | G01R 31/3679 |
| | | | 324/426 |
| 2014/0225571 A1 | 8/2014 | Obata et al. | |
| 2015/0239365 A1* | 8/2015 | Hyde | B60L 11/1861 |
| | | | 701/2 |

FOREIGN PATENT DOCUMENTS

| | | |
|---|---|---|
| JP | 2012-155981 A | 8/2012 |
| JP | 2013-051115 A | 3/2013 |
| JP | 2013-214372 A | 10/2013 |
| JP | 2014003826 A | 1/2014 |
| JP | 201435825 A | 2/2014 |
| JP | 2014-041768 A | 3/2014 |
| KR | 10-2011-0136470 A | 12/2011 |
| KR | 10-2014-0066729 A | 6/2014 |

\* cited by examiner

FIG. 10

|  | EMBODIMENT | FIRST COMPARATIVE EMBODIMENT | SECOND COMPARATIVE EMBODIMENT |
|---|---|---|---|
| USER'S USAGE | LARGE IMBALANCE TOWARD EXCESSIVE CHARGE | LARGE IMBALANCE TOWARD EXCESSIVE CHARGE | LARGE IMBALANCE TOWARD EXCESSIVE CHARGE |
| USAGE BATTERY | GRADE OF WHICH RESISTANCE TO EXCESSIVE CHARGE IS HIGH | GENERAL GRADE | GRADE OF WHICH RESISTANCE TO EXCESSIVE CHARGE IS LOW |
| INPUT/OUTPUT LIMITATION INTERVENING FREQUENCY | 1 | 1.5 | 2 |

BATTERY MANAGEMENT TERMINAL AND BATTERY MANAGEMENT SYSTEM

INCORPORATION BY REFERENCE

The disclosure of Japanese Patent Application No. 2014-129088 filed on Jun. 24, 2014 including the specification, drawings and abstract is incorporated herein by reference in its entirety.

BACKGROUND OF THE INVENTION

1. Field of the Invention

The invention relates to a battery management terminal and a battery management system that determine characteristics required of a replacement secondary battery at the time when a secondary battery is replaced.

2. Description of Related Art

In recent years, hybrid vehicles, electric vehicles, and the like, are developed as measures against environmental issues. Batteries, such as lithium ion secondary batteries, are mounted on these vehicles. Batteries that are mounted on vehicles are collected when the vehicles are discarded or when the batteries are replaced for repair. Collected batteries are reused through processes, such as recycling, reusing and rebuilding.

Recycling is a process to recycle a battery by decomposing the battery. Reusing is a process to reutilize a battery pack directly. Rebuilding is a process to disassemble a battery pack, gather reutilizable battery cells and then rebuild a new battery pack.

Japanese Patent Application Publication No. 2012-155981 (JP 2012-155981 A) describes a technique for, when a storage battery is reused, drawing out performance commensurately with the characteristics of a reused battery by utilizing information about variations in storage battery performance, resulting from a usage situation in primary use for charge and discharge control by transmitting the information to a device that uses the reused battery.

The technique described in JP 2012-155981 A is to adapt the characteristics of a device that uses a reused battery to the characteristics of the reused battery. However, when a user's usage of the device is not an ordinary usage depending on user's taste, or the like, there is a possibility that a battery after replacement does not meet a user's request.

Particularly, when a discharge of a battery at a large current (hereinafter, also referred to as "high-rate discharge") is continued, the internal resistance of the battery can temporarily (reversibly) increase. Continuation of such a usage situation leads to degradation of the battery. When a user prefers using a battery in a situation that a high-rate discharge easily occurs, a battery after replacement is desirably a battery highly resistant to a high-rate discharge. A charge of a battery at a large current (hereinafter, also referred to as "high-rate charge") is also similarly understood.

However, in JP 2012-155981 A, it has not been studied that a reused battery can be inappropriate for a usage that is required by a user or the history of a user's usage is read out from a device that uses a reused battery, so there is still room for improvement.

SUMMARY OF THE INVENTION

The invention provides a battery management terminal and a battery management system that is able to select a replacement battery suitable for a user's usage of a device.

A battery management terminal related to the present invention is for a secondary battery mounted on a device. The device includes a first electronic control unit. The first electronic control unit is configured to detect a current flowing through the secondary battery. The first electronic control unit is configured to estimate a change in ion concentration imbalance in an electrolyte of the secondary battery on the basis of a history of the detected current. The first electronic control unit is configured to calculate an evaluation value associated with degradation of the secondary battery due to a charge or a discharge on the basis of an estimated change in ion concentration imbalance. The first electronic control unit is configured to store historical information of the evaluation value. The battery management terminal includes a second electronic control unit and an inform unit. The second electronic control unit is configured to, at the time when the secondary battery is replaced, acquire the historical information of the evaluation value of the secondary battery before replacement from the first electronic control unit. The second electronic control unit is configured to determine required characteristics required of a replacement secondary battery on the basis of the historical information of the evaluation value. The inform unit is configured to inform the required characteristics determined by the second electronic control unit.

With the above configuration, when a usage of the device has such a tendency that an ion concentration imbalance in the electrolyte of the secondary battery easily occurs, it is possible to inform a user of the characteristics required of a replacement secondary battery in consideration of such a tendency at replacement timing.

The usage history of a battery at the time when the device on which the secondary battery is mounted is used is recorded, and it is possible to read out the usage history at the time of battery replacement, so it is possible to select a replacement battery suitable for the user's usage of the device.

The second electronic control unit may be configured to determine an imbalance in an occurrence frequency of a charge or an occurrence frequency of a discharge in the device on the basis of the historical information of the evaluation value. The second electronic control unit may be configured to inform characteristics of a secondary battery suitable for the imbalance as the required characteristics.

Through the above control, when usage of the device tends to be an imbalance toward a high-rate charge or a high-rate discharge, it is possible to inform the user of the characteristics of a secondary battery suitable for that usage.

The device further may include a load that receives an output from the secondary battery. The first electronic control unit may be configured to, when an integrated value of the evaluation value exceeds a permissible value, lower an upper limit of the output of the secondary battery to the load, than when the integrated value of the evaluation value is equal to or smaller than the permissible value. The first electronic control unit may store the permissible value. The second electronic control unit may be configured to, when a secondary battery that satisfies the required characteristics is installed into the device as a replacement battery, rewrite a stored permissible value to a value larger than the stored permissible value.

With the above configuration, the second electronic control unit resets the permissible value such that an output of the device after battery replacement is difficult to be limited, so the device is able to exercise further high performance.

Furthermore, the inform unit may be a display.

A battery management system related to the present invention includes a device and a battery management terminal. The device includes a secondary battery and a first electronic control unit. The first electronic control unit is configured to detect a current flowing through the secondary battery. The first electronic control unit is configured to estimate a change in ion concentration imbalance in an electrolyte of the secondary battery on the basis of a history of the detected current. The first electronic control unit is configured to calculate an evaluation value associated with degradation of the secondary battery due to a charge or a discharge on the basis of an estimated change in ion concentration imbalance. The first electronic control unit is configured to store historical information of the evaluation value. The battery management terminal includes a second electronic control unit and an inform unit. The second electronic control unit is configured to, at the time when the secondary battery is replaced, acquire the historical information of the evaluation value of the secondary battery before replacement from the first electronic control unit. The second electronic control unit is configured to determine required characteristics required of a replacement secondary battery on the basis of the historical information of the evaluation value. The inform unit is configured to inform the required characteristics determined by the second electronic control unit.

With the above configuration, when a usage of the device has such a tendency that an ion concentration imbalance in the electrolyte of the secondary battery easily occurs, it is possible to inform a user of the characteristics required of a replacement secondary battery in consideration of such a tendency at replacement timing.

The usage history of a battery at the time when the device on which the secondary battery is mounted is used is recorded, and it is possible to read out the usage history at the time of battery replacement, so it is possible to select a replacement battery suitable for the user's usage of the device.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 10 is a table for illustrating an example in which fuel economy improves depending on a battery to be used.

DETAILED DESCRIPTION OF EMBODIMENTS

Figure 1:
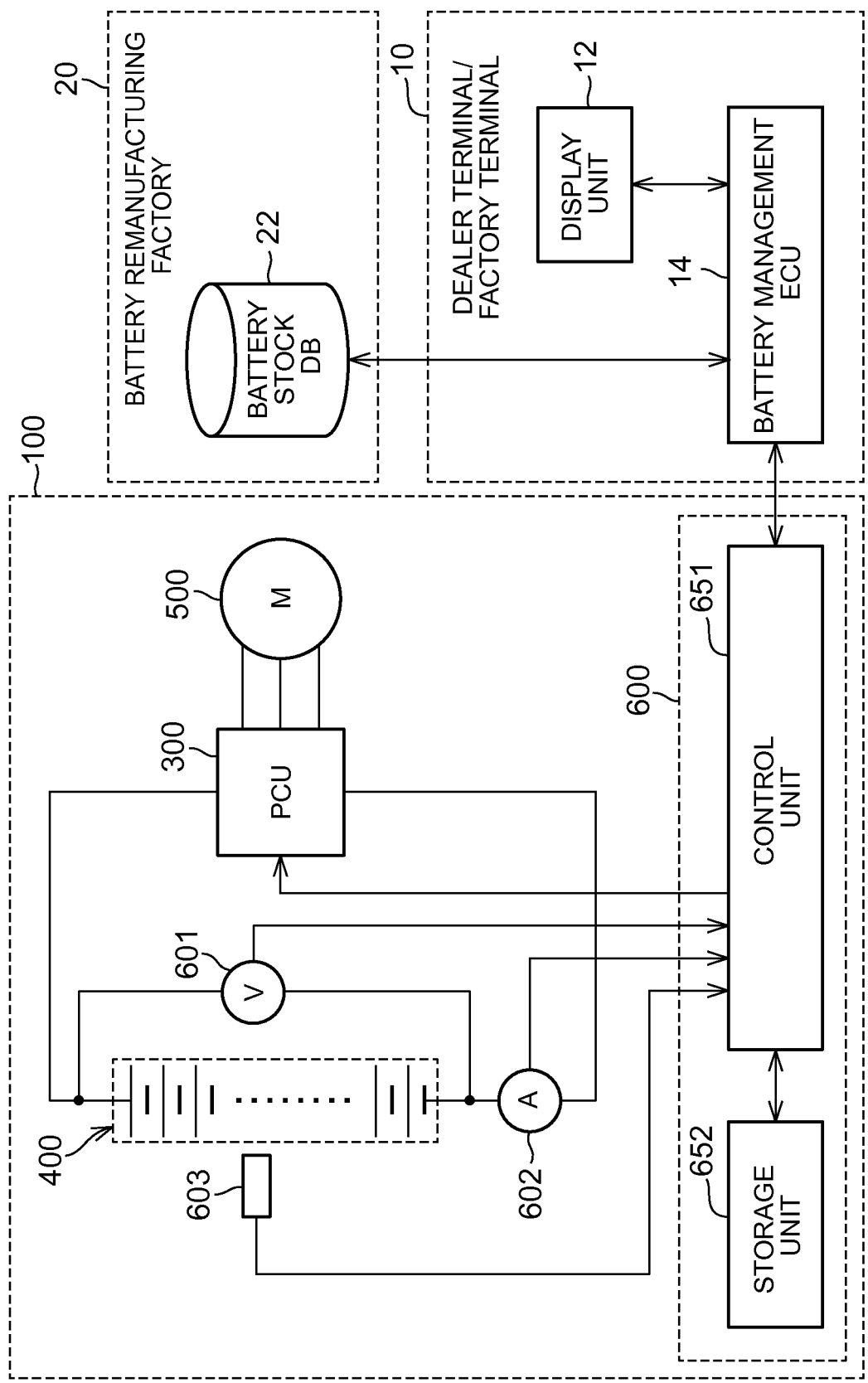
FIG. 1 is a view that shows the configuration of a battery management system according to an embodiment.

Hereinafter, an embodiment of the invention will be described with reference to the accompanying drawings. In the following description, like reference numerals denote the same components. The names and functions of them are also the same. Therefore, the detailed description of them will not be repeated.

FIG. 1 is a view that shows the configuration of a battery management system according to the present embodiment. As shown in FIG. 1, the battery management system is implemented by a terminal 10 and a vehicle 100. The terminal 10 is configured to be communicable with the vehicle 100. A battery stock database 22 may be arranged in a battery remanufacturing factory 20, or the like, and able to communicate with the terminal 10.

The vehicle 100 includes a power control unit (PCU) 300, a battery 400, a drive motor 500, and a vehicle electronic control unit (ECU) 600 connected to these components.

The vehicle 100 shown in FIG. 1 is an electric vehicle on which the drive motor 500 is mounted. However, not limited to the vehicle shown in FIG. 1, the invention may be applied to any vehicle that travels by using electric power energy, such as a hybrid vehicle on which an engine is further mounted in addition to the drive motor 500.

The battery 400 is a battery pack in which a plurality of modules each including a plurality of lithium ion secondary battery cells integrated together are connected in series with each other. The positive electrode of each lithium ion secondary battery cell is made of a material that is able to reversibly occlude or release lithium ions (hereinafter, also referred to as "lithium salt") (for example, a lithium-containing oxide). The positive electrode releases lithium salt into an electrolytic solution in a charging process, and occludes lithium salt in the electrolytic solution in a discharging process. The negative electrode of each lithium ion secondary battery cell is made of a material that is able to reversibly occlude or release lithium salt (for example, carbon). The negative electrode occludes lithium salt in the electrolytic solution in the charging process, and releases lithium salt into the electrolytic solution in the discharging process.

The motor 500 is a three-phase alternating-current motor, and is driven by electric power stored in the battery 400. The driving force of the motor 500 is transmitted to wheels (not shown).

The ECU 600 incorporates a control unit 651 and a storage unit 652. The ECU 600 is configured to execute predetermined arithmetic processing on the basis of maps and programs stored in the storage unit 652.

A voltage sensor 601, a current sensor 602 and a temperature sensor 603 are provided in the battery 400. The voltage sensor 601 detects the voltage between both ends (hereinafter, "battery voltage VB") of the battery 400. The current sensor 602 detects the current flowing through the battery 400 (hereinafter, also referred to as "charge and discharge current I"). In the following description, the charge and discharge current I is a positive value during discharging, and the charge and discharge current I is a negative value during charging. The temperature sensor 603 detects the temperature of the battery 400 (hereinafter, also referred to as "battery temperature TB"). These sensors output detected results to the ECU 600.

In the thus configured vehicle, when a high-rate discharge of the battery 400 is continued, there is a case where the internal resistance of the battery 400 temporarily (reversibly) increases and the output voltage of the battery 400 decreases. It is understood that the imbalance of lithium salt in the electrolytic solution due to continuation of a high-rate discharge is one of factors responsible for a decrease in output voltage. When the state of a temporal increase in the internal resistance of the battery 400 continues because of the continuation of a high-rate discharge, irreversible degradation of the battery 400 is incurred.

Whether to continue a high-rate discharge depends on how a user drives the vehicle. When the battery 400 degrades and the performance decreases, it is conceivable to replace the battery 400. In the case of a user who prefers to use a battery in the situation that a high-rate discharge easily occurs, it is desirable to replace the battery with a battery highly resistant to a high-rate discharge. A charge of a battery at large current (hereinafter, also referred to as "high-rate charge") is also similarly understood.

In the battery management system according to the present embodiment, a technique for, when the battery is replaced, prompting the user to select an appropriate battery by informing the user of characteristics required of a battery suitable for a user's usage is employed. Specifically, an evaluation value that indicates a user's usage is calculated in the vehicle 100, and the historical information of the evaluation value is stored in the vehicle 100. A battery management ECU 14 of a dealer terminal or factory terminal reads out the historical information of the evaluation value from the vehicle upon user's request for battery replacement. The battery management ECU 14 selects a replacement battery, suitable for the user's usage on the basis of the read historical information, and informs the user of the characteristics required of the replacement battery with the use of a display unit 12. The way of inform is not limited to the display but an audio guidance may also be used. The display unit 12 or the audio guidance are the examples of a inform unit.

The control unit 651 of the ECU 600 estimates changes in ion concentration imbalance in the electrolyte of the battery 400 on the basis of the history of a detected value of the current sensor 602, and calculates an evaluation value associated with degradation of the battery 400 due to a charge or a discharge on the basis of the estimated changes in ion concentration imbalance. The storage unit 652 stores the historical information of the evaluation value.

In this way, the historical information of the calculated and stored evaluation value is used in the terminal 10. The terminal 10 is arranged at a dealer or a battery remanufacturing factory. The terminal 10 includes the battery management ECU 14 and the display unit 12. At the time when the battery 400 is replaced, the battery management ECU 14 acquires the historical information of the evaluation value of the battery 400 before replacement from the storage unit 652, and determines the characteristics required of a replacement battery on the basis of the historical information of the evaluation value. The display unit 12 informs the user of the determined result of the battery management ECU 14. The battery before replacement is the battery already mounted on the vehicle. The replacement battery is a battery that is newly installed in the vehicle. That is, replacement of the battery 400 is that the battery before replacement is replaced by the replacement battery.

With the above configuration, when the usage of the vehicle 100 has such a tendency that a high-rate discharge, a high-rate charge, or the like, easily occurs or such a tendency that an ion concentration imbalance in the electrolyte of the battery 400 easily occurs, it is possible to inform the user of the characteristics required of a replacement battery 400 in consideration of such a tendency at replacement timing.

As an example of the above-described evaluation value, a battery degradation evaluation value D described in Japanese Patent No. 4494453, Japanese Patent Application Publication No. 2013-051115 (JP 2013-051115 A), or Japanese Patent Application Publication No. 2013-214372 (JP 2013-214372 A) may be used.

The ion concentration imbalance due to a charge or a discharge returns with a lapse of time. Briefly speaking, the battery degradation evaluation value D is a value that indicates the degree of remaining imbalance of ions, and is calculated by the following mathematical expression (1).

$$D(N)=(1-A\times\Delta T)\times D(N-1)+(B/C)\times I\times\Delta T \quad (1)$$

$D(N)$ and $D(N-1)$ respectively denote a current evaluation value D and a last evaluation value D calculated one computation cycle before, A denotes a forgetting factor, and $\Delta T$ denotes the computation cycle time of the evaluation value D. B denotes the coefficient of current, C denotes the limit threshold of current, and I denotes a battery current. The forgetting factor A becomes a larger value as the diffusion velocity of lithium ions in the battery increases or as the cycle time $\Delta T$ increases. The forgetting factor A, the coefficient of current B and the limit threshold C may be prepared in the form of a map through which values are obtained when the battery temperature TB and the SOC of the battery are input.

The first term of the mathematical expression (1) indicates that the evaluation value D approaches zero with a lapse of time. The second term indicates that the evaluation value D increases because of a discharge and the evaluation value D decreases because of a charge. Because I<0 during charging, the evaluation value D is a negative value in the case of an excessive charge.

Figure 2:
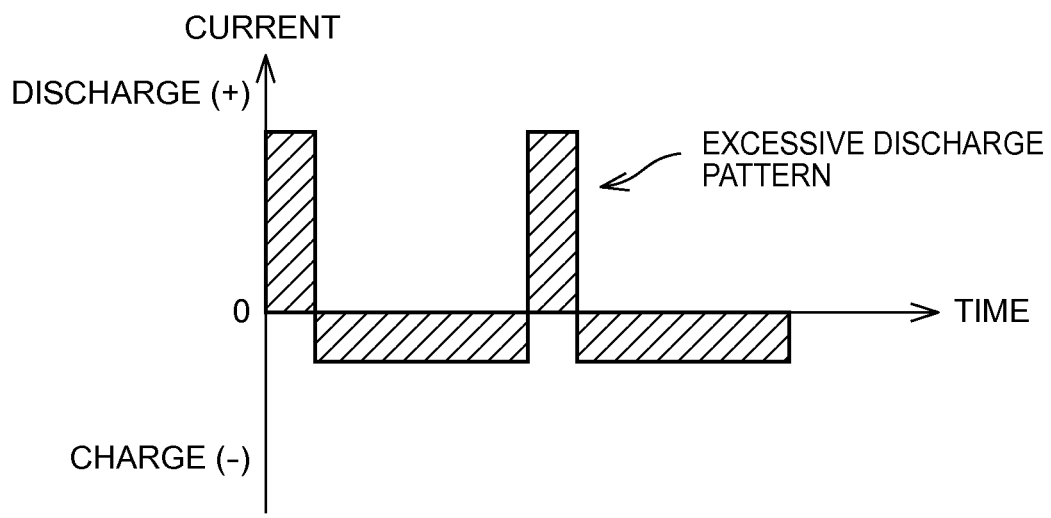
FIG. 2 is a graph that schematically shows the charge and discharge pattern of an excessive discharge.
Figure 3:
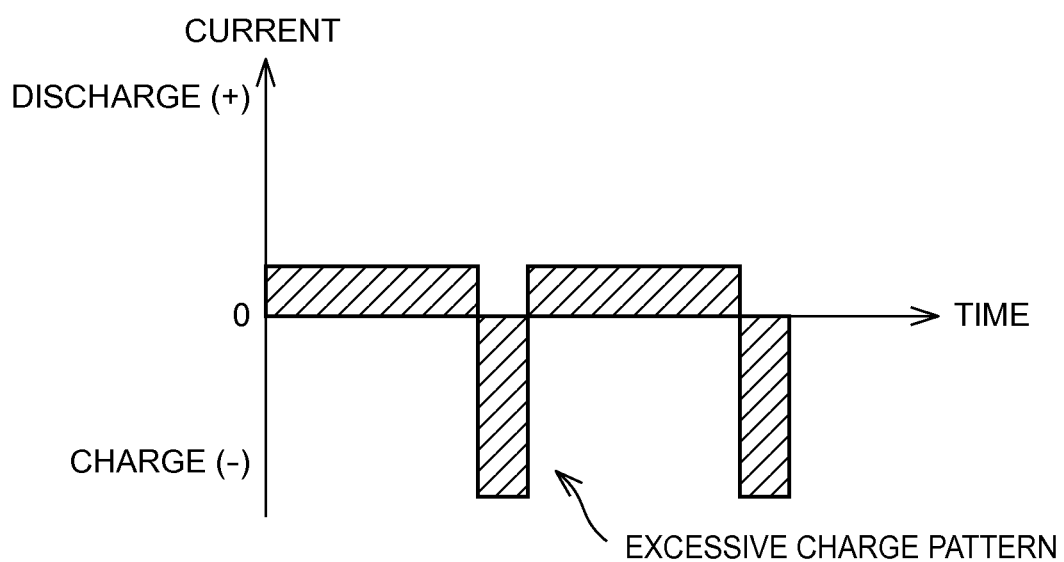
FIG. 3 is a graph that schematically shows the charge and discharge pattern of an excessive charge.

FIG. 2 is a graph that schematically shows the charge and discharge pattern of an excessive discharge. FIG. 3 is a graph that schematically shows the charge and discharge pattern of an excessive charge. When the excessive discharge pattern shown in FIG. 2 continues, the evaluation value D becomes a positive value. When the excessive charge pattern shown in FIG. 3 continues, the evaluation value D becomes a negative value.

Figure 4:
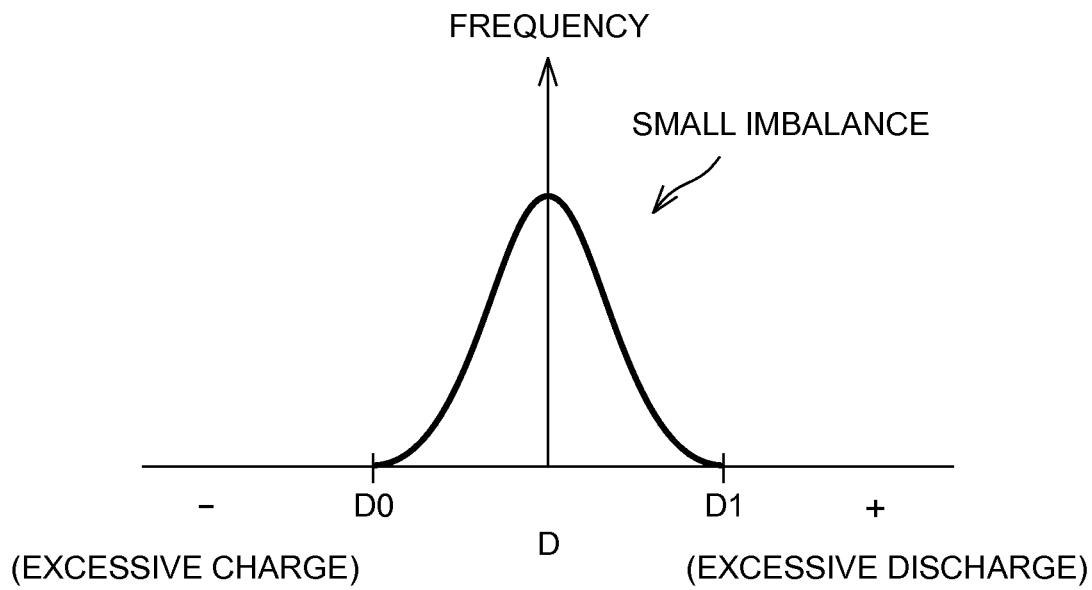
FIG. 4 is a graph that shows the distribution of a battery degradation evaluation value D in the case of a small imbalance in a charge or discharge.
Figure 5:
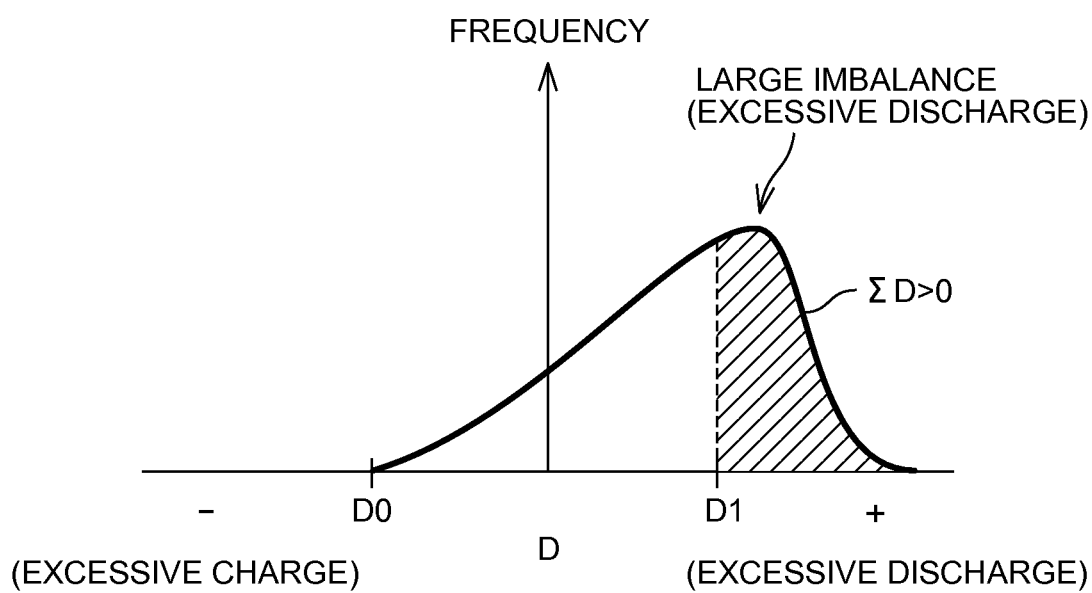
FIG. 5 is a graph that shows the distribution of a battery degradation evaluation value D in the case of a large imbalance in a charge or discharge.

A battery degradation integrated value $\Sigma D$ is used as a value that corresponds to the amount of damage accumulated in the battery 400. How the battery degradation integrated value $\Sigma D$ is calculated from the evaluation value D will be described. FIG. 4 is a graph that shows the distribution of the battery degradation evaluation value D in the case of a small imbalance in a charge or discharge. FIG. 5 is a graph that shows the distribution of the battery degradation evaluation value D in the case of a large imbalance in a charge or discharge. In FIG. 4 and FIG. 5, the battery degradation evaluation value D is stored at constant intervals, and the history of the distribution of values stored within a predetermined period is shown.

As shown in FIG. 4, when the evaluation value D falls within the range between a predetermined value D0 and a predetermined value D1, the correlation between the battery degradation evaluation value D and the amount of damage accumulated in the battery 400 is low, and the imbalance is small. The evaluation value D that falls within the range between the predetermined value D0 and the predetermined value D1 is not used to calculate the battery degradation integrated value ΣD. Therefore, the battery degradation integrated value ΣD does not increase or decrease and remains at the same value. When FIG. 4 shows the distribution of the evaluation value D for the latest predetermined period (for example, 14 days), the battery degradation integrated value ΣD for this predetermined period is zero, and a small imbalance toward a high-rate charge or a high-rate discharge is indicated.

On the other hand, as shown in FIG. 5, when the evaluation value D falls outside the range between the predetermined value D0 and the predetermined value D1, it is determined that the imbalance is large. The evaluation value D that falls outside the range between the predetermined value D0 and the predetermined value D1 is used to calculate the battery degradation integrated value ΣD. When FIG. 5 shows the distribution of the evaluation value D for the latest predetermined period (for example, 14 days), the battery degradation integrated value ΣD for the predetermined period becomes a positive value, and a usage imbalance toward a high-rate discharge is indicated. On the other hand, in the case of the pattern different from FIG. 5, when the battery degradation integrated value ΣD becomes a negative value, a usage imbalance toward a high-rate charge is indicated.

The battery degradation integrated value ΣD is stored in the storage unit of the vehicle for each predetermined time from the start of usage of the battery to right before replacement, and the history of the battery degradation integrated value ΣD is investigated by reading out the battery degradation integrated value ΣD. Thus, it is possible to look into what usage of discharge pattern the user of the vehicle prefers. Charge pattern depends on the characteristic of a region in which the vehicle is used (for example, whether there is a hill, whether there is a rapid charging station, or the like). Therefore, when the history of the battery degradation integrated value ΣD is investigated, there is a case where a characteristic usage in a region in which the vehicle is mainly used is found. The history of the battery degradation integrated value ΣD is also the historical information of the battery degradation evaluation value D.

How the battery degradation integrated value ΣD is calculated in the vehicle will be simply described with reference to the block diagram.

Figure 6:
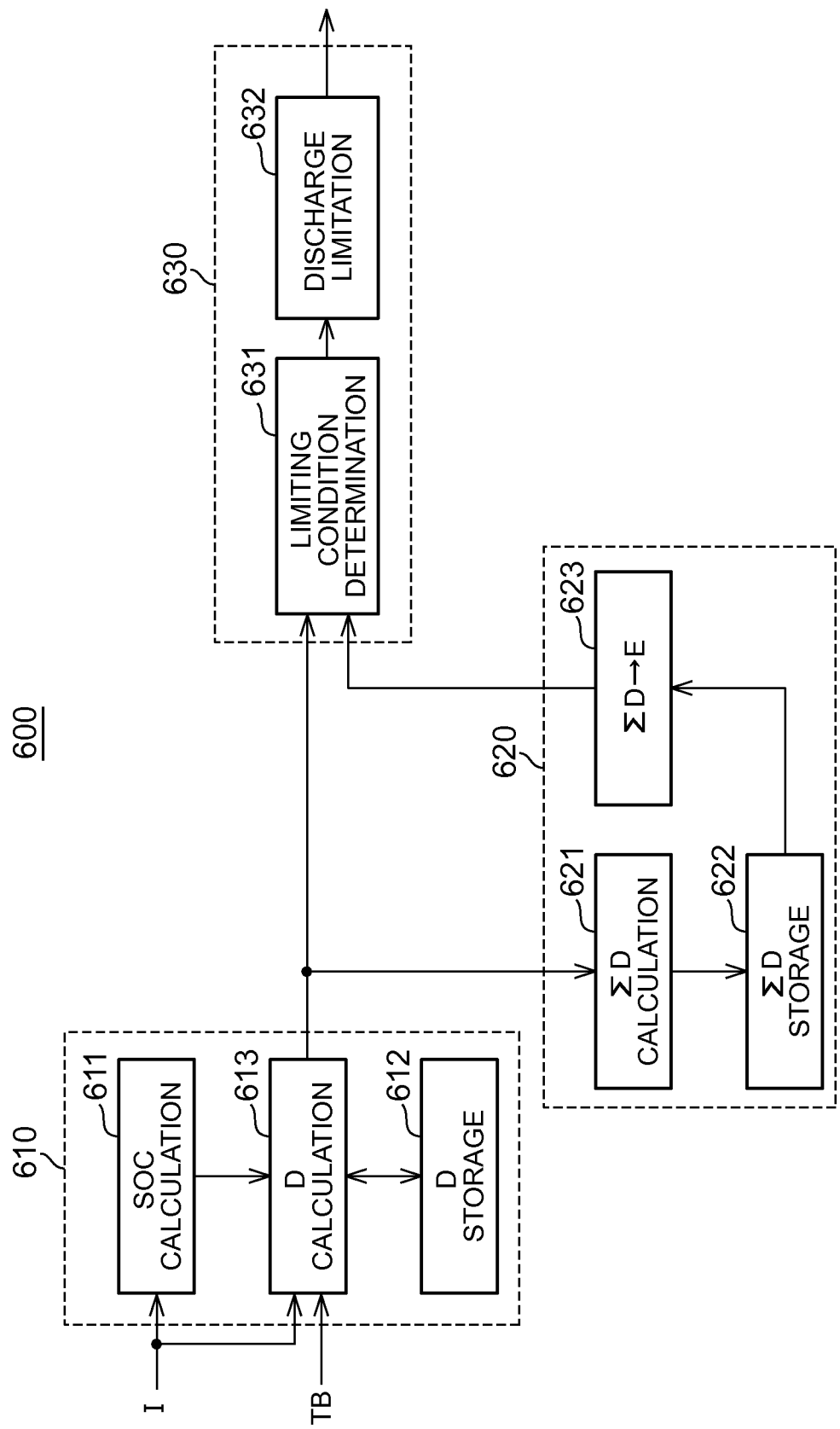
FIG. 6 is a functional block diagram of an ECU 600.

FIG. 6 is a functional block diagram of the ECU 600. Functional blocks shown in FIG. 6 may be implemented by hardware or may be implemented by software. The ECU 600 includes a calculation unit 610, a setting unit 620, and a control unit 630.

The calculation unit 610 calculates the battery degradation evaluation value D in response to a change in the imbalance of lithium salt. The setting unit 620 variably controls a target value E in response to the battery degradation integrated value ΣD. The target value E is used to determine whether to limit the output of the battery. The control unit 630 is a portion that limits the input/output electric power of the battery 400 in response to the target value E. The details of the control unit 630 will be described later in an alternative embodiment that relates to limiting of input/output electric power. Here, the calculation unit 610 and the setting unit 620 that are required to calculate the battery degradation integrated value ΣD will be described.

The calculation unit 610 includes a calculation unit 611, a storage unit 612, and a calculation unit 613. The calculation unit 611 calculates the SOC of the battery 400 from the charge and discharge current I. The calculation unit 613 calculates the battery degradation evaluation value D (current value) at intervals of one computation cycle time by using the above-described mathematical expression (1) on the basis of the discharge current value I, the battery temperature TB, and the battery degradation evaluation value D (last value) stored in the storage unit 612. The storage unit 612 stores the battery degradation evaluation value D calculated in the calculation unit 613.

The setting unit 620 includes an integration unit 621, a storage unit 622, and a target value setting unit 623. The integration unit 621 calculates the battery degradation integrated value ΣD. The integration unit 621 calculates the total value of the battery degradation evaluation values D within the latest predetermined period (for example, 14 days) as the battery degradation integrated value ΣD. A technique for calculating the battery degradation integrated value ΣD is not limited to this configuration.

As described with reference to FIG. 4 and FIG. 5, when the battery degradation evaluation value D falls within the range from the predetermined value D0 (<0) to the predetermined value D1 (>0), the correlation between the battery degradation evaluation value D and the amount of damage accumulated in the battery 400 is low, so the integration unit 621 does not add the battery degradation evaluation value D to the battery degradation integrated value ΣD. On the other hand, when the battery degradation evaluation value D falls outside the range from the predetermined value D0 (<0) to the predetermined value D1 (>0), the integration unit 621 adds the battery degradation evaluation value D to the battery degradation integrated value ΣD.

The storage unit 622 stores the battery degradation integrated value ΣD calculated by the integration unit 621. The storage units 612, 622 are collectively shown as the storage unit 652 in FIG. 1, and the other portions that execute arithmetic processing are collectively shown as the control unit 651 in FIG. 1.

The information about the history of the evaluation value D calculated and stored in the vehicle as described above is allowed to be read out and used by the battery management system for the purpose of selecting a replacement battery suitable for a usage at the time when the battery of the vehicle is replaced.

Figure 7:
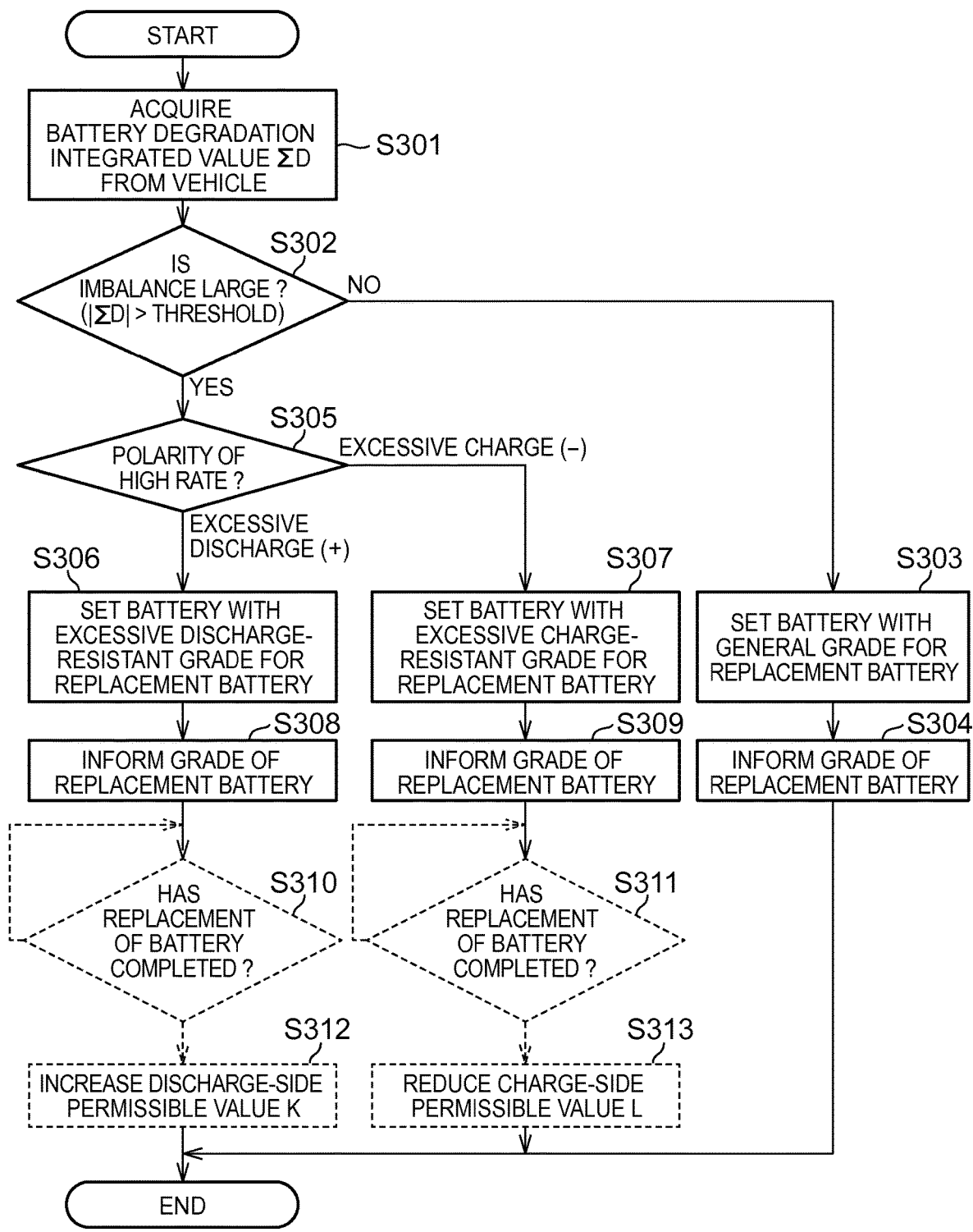
FIG. 7 is a flowchart for illustrating a replacement battery selecting process that is executed in the battery management system.

FIG. 7 is a flowchart for illustrating a replacement battery selecting process that is executed in the battery management system. The process of this flowchart is, for example, executed by the battery management ECU 14 shown in FIG. 1 when the user who wants to replace the battery drives the vehicle to a dealer and the terminal of the dealer is connected to the vehicle ECU 600.

As shown in FIG. 1 and FIG. 7, in S301, the battery management ECU 14 communicates with the vehicle ECU 600, and acquires the battery degradation integrated value ΣD. The battery degradation integrated value ΣD is a kind of the historical information of the battery degradation evaluation value D. When there is an imbalance in the evaluation value D toward a positive side or a negative side, the battery 400 receives damage, and the battery degradation integrated value ΣD is a value that indicates the degree to which the damage is accumulated.

Subsequently, in S302, the battery management ECU 14 determines whether there is a large imbalance in a charge or discharge of the battery on the basis of the historical information of the battery degradation integrated value ΣD.

Where the battery degradation integrated value ΣD is a value calculated on the basis of the battery degradation evaluation values D within the latest predetermined period (for example, 14 days), the battery degradation integrated value ΣD is recorded for each predetermined period. In S302, the total of the battery degradation integrated values ED recorded for the corresponding predetermined periods is calculated, and it just needs to be determined that the imbalance is large when the absolute value of the total of the battery degradation integrated values ΣD exceeds a predetermined threshold.

In S302, when it is determined that the imbalance is not large (NO in S302), the process proceeds to S303, and it is determined that a battery with a general grade is used for a replacement battery. In S304, the grade of the replacement battery, corresponding to the determined result, is displayed on the display unit 12. In S302, when it is determined that the imbalance is large (YES in S302), the process proceeds to S305.

In S305, the battery management ECU 14 determines whether the polarity of a high-rate charge and discharge indicates an excessive charge or an excessive discharge on the basis of the sign of the battery degradation integrated value ΣD. In S305, when the polarity indicates an excessive discharge (the sign is +), the process proceeds to S306; whereas, when the polarity indicates an excessive charge (the sign is −), the process proceeds to S307.

In S306, it is determined that a battery with an excessive discharge-resistant grade is used for a replacement battery. In S308, the grade of the replacement battery, corresponding to the determined result, is displayed on the display unit 12. On the other hand, in S307, it is determined that a battery with an excessive charge-resistant grade is used for a replacement battery. In S309, the grade of the replacement battery, corresponding to the determined result, is displayed on the display unit 12. The battery with a general grade, the battery with an excessive discharge-resistant grade and the battery with an excessive charge-resistant grade are described; however, batteries having such grades may be manufactured in advance by changing the negative electrode density, or the like, in designing batteries.

When the process of any one of S304, S308 or S309 ends, the process of the flowchart ends. The processes of S310 to S313 are optional, and will be described later in the description of the alternative embodiment.

As described above, the battery management ECU 14 determines an imbalance between the occurrence frequency of a high-rate charge and the occurrence frequency of a high-rate discharge in the vehicle 100 on the basis of the history of the integrated value ΣD. The integrated value ΣD is a kind of the historical information of the evaluation value D (S302). Then, the characteristics of the battery 400 (for example, the grade of the battery) suitable for the imbalance in the occurrence frequency are set as the required characteristics and are informed on the display unit 12 (S304, S308, S309).

Through the above-described control, when the usage of battery 400 tends to be an imbalance toward a high-rate charge or a high-rate discharge in the vehicle 100, it is possible to inform a user or a worker at a dealer or a factory of the characteristics of the battery 400 suitable for the usage.

In S303, S306, S307 shown in FIG. 7, the battery with a general grade, the battery with an excessive discharge-resistant grade and the battery with an excessive charge-resistant grade are described, and it is also described that batteries having such grades may be manufactured in advance by changing the negative electrode density, or the like, in designing batteries. As another method for preparing batteries by grade, batteries, such as reuse products, may be separated by grade.

In FIG. 1, when the terminal 10 is a factory terminal, the battery management ECU 14 acquires information about the evaluation value D from a discarded vehicle or a vehicle of which a battery has not been replaced yet. When the batteries of those vehicles are reuse products, information about the evaluation value D and information that indicates resistance to a high-rate charge/discharge are recorded in the battery stock database 22 of the battery remanufacturing factory 20 together with battery identification information. The battery identification information is, for example, the value of an ID tag, or the like. The rate of increase in high-rate resistance may be calculated from a battery current and a battery voltage and recorded in the vehicle as an example of the information that indicates resistance to a high-rate charge/discharge. The rate of increase in high-rate resistance is the rate of increase in battery resistance at the time of occurrence of a high-rate charge/discharge.

Figure 8:
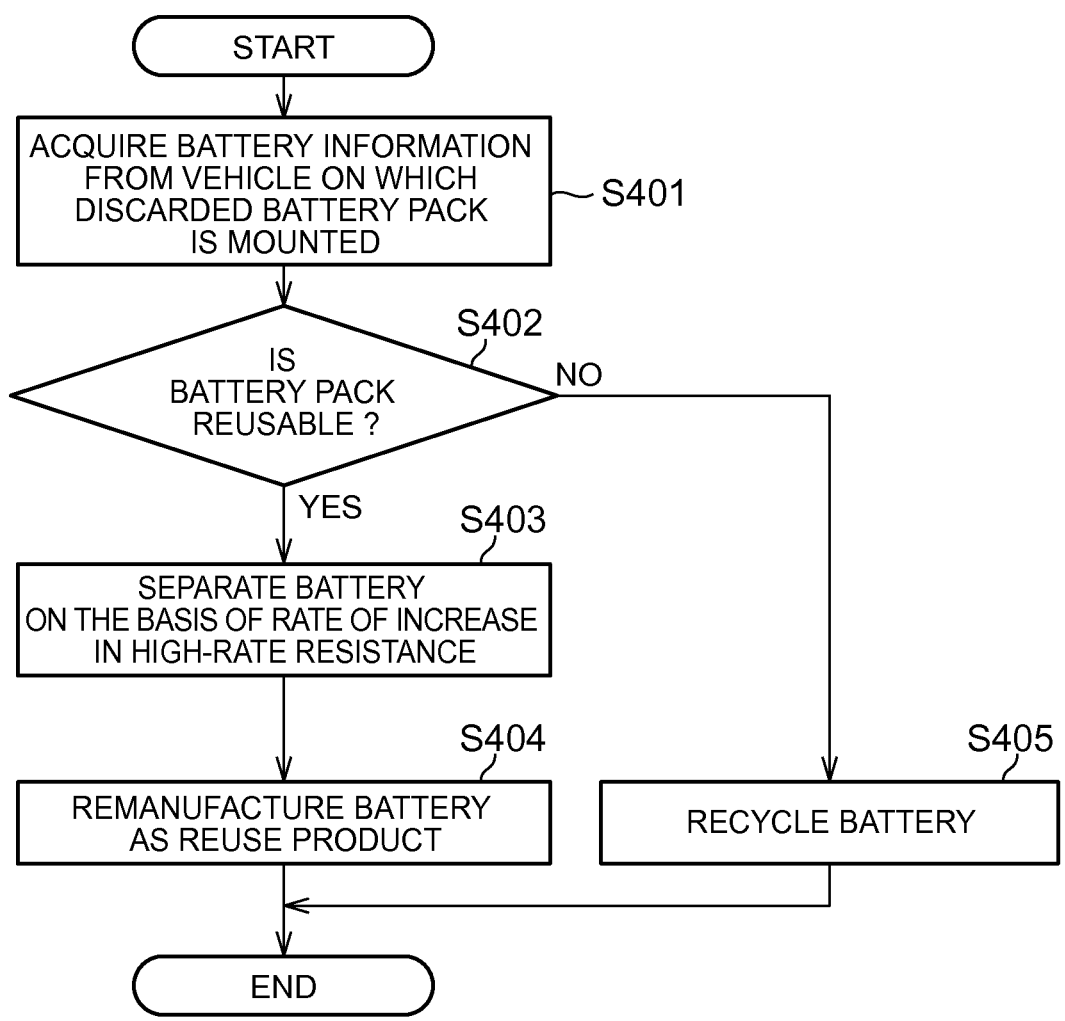
FIG. 8 is a flowchart that shows a manufacturing process at a factory for classification by grades at the time of reusing.

FIG. 8 is a flowchart that shows a manufacturing process at a factory at which reused batteries are classified by grade at the time of reusing. As shown in FIG. 8, initially, in S401, a worker acquires battery information at the battery remanufacturing factory from a vehicle on which a battery pack to be discarded is mounted by connecting a communication cable to the vehicle.

In S402, the internal resistance, full charge capacity, and the like, of the battery is measured, and it is determined whether the battery is reusable. When it is determined in S402 that the battery is not reusable, the battery is recycled in S405, and the process ends. On the other hand, when it is determined in S402 that the battery is reusable, the process proceeds to S403.

In S403, the battery is classified on the basis of the rate of increase in resistance at a high-rate discharge. The rate of increase in resistance at a high-rate discharge, accumulated as data when the battery is mounted on the vehicle, may be used or the rate of increase in resistance at the time when a high-rate charge/discharge is newly carried out at the factory may be measured. A battery of which the rate of increase in resistance at a high-rate discharge is smaller than a predetermined determination value is classified into the battery with an excessive discharge-resistant grade. This may also be similarly understood at a high-rate charge.

This classification may be made on the basis of a designed value of a battery or may be made on the basis of an actually measured value resulting from a test by extracting a cell.

When the classification in S403 completes, a battery is remanufactured in S404 as a reuse product, and the process ends.

Hereinafter, an alternative embodiment will be described. When the state where the internal resistance of the battery 400 is temporarily increased continues because of continuation of a high-rate discharge, irreversible degradation of the battery 400 is incurred. In order to prevent this situation, it is required to suppress continuation of a high-rate discharge. Therefore, the ECU 600 sets a charge power upper limit value WIN and a discharge power upper limit value WOUT (both in watts) in response to the state of the battery 400, the actual charge power and actual discharge power of the battery 400 are controlled so as not to respectively exceed the charge power upper limit value WIN and the discharge power upper limit value WOUT. On the other hand, when continuation of a high-rate discharge is excessively suppressed, there is a concern that it is not possible to sufficiently exercise vehicle power performance that is required by the user.

In the alternative embodiment, in combination with the fact that the battery suitable for a user's usage is selected as a replacement battery, the vehicle on which the replacement battery is mounted is caused to exercise the vehicle power performance that is required by the user as much as possible by rewriting control data for the vehicle such that the charge power upper limit value WIN and the discharge power upper limit value WOUT are raised.

Initially, limiting of charge power and discharge power, which is executed in the vehicle, will be described again with reference to FIG. 6. The control unit 630 shown in FIG. 6 limits the charge power and the discharge power. The target value E is determined as a parameter that is compared with the battery degradation evaluation value D for the purpose of executing this control. The target value setting unit 623 reads out the battery degradation integrated value $\Sigma D$ stored in the storage unit 622, and variably controls the target value E in response to the battery degradation integrated value $\Sigma D$.

The control unit 630 controls the actual discharge power (hereinafter, referred to as "actual discharge power P") in response to the result of comparison between the battery degradation evaluation value D and the target value E. The control unit 630 limits a discharge of the battery 400 (hereinafter, this limitation is also referred to as "WOUT limitation") by reducing the discharge power upper limit value WOUT when the condition that the battery degradation evaluation value D exceeds the target value E (hereinafter, also referred to as "limiting condition") is satisfied. Through this WOUT limitation, degradation of the battery 400 due to a high-rate discharge is suppressed.

The control unit 630 includes a determination unit 631 and a limiting unit 632. The determination unit 631 determines whether the above-described limiting condition is satisfied. The limiting unit 632 sets the discharge power upper limit value WOUT to a smaller value when the limiting condition is satisfied than when the limiting condition is not satisfied. The limiting unit 632 controls the PCU 300 such that the actual discharge power P does not exceed the discharge power upper limit value WOUT. Thus, the actual discharge power P is more limited when the limiting condition is satisfied than when the limiting condition is not satisfied.

Figure 9:
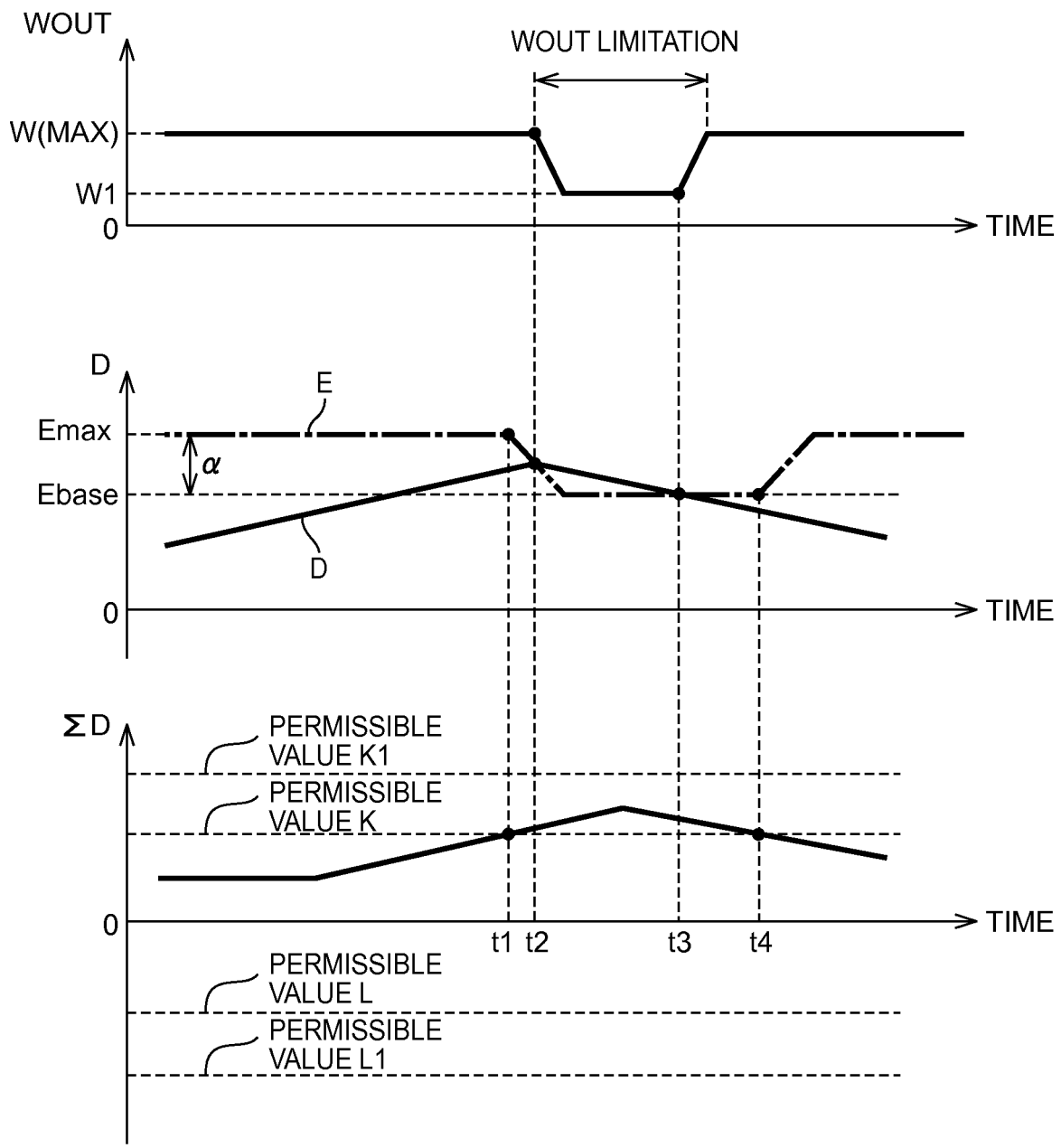
FIG. 9 is a time chart that schematically shows an example of temporal changes in discharge power upper limit value WOUT, battery degradation evaluation value D, target value E and battery degradation integrated value ΣD.

FIG. 9 is a time chart that schematically shows an example of temporal changes in discharge power upper limit value WOUT, battery degradation evaluation value D, target value E and battery degradation integrated value $\Sigma D$.

As shown in FIG. 6 and FIG. 9, in the range in which the battery degradation integrated value $\Sigma D$ before time t1 is smaller than a permissible value K, the target value E is set to a maximum value Emax larger by a predetermined value cc than a reference value Ebase. On the other hand, in the range in which the battery degradation integrated value $\Sigma D$ after time t1 exceeds the permissible value K, the target value E is gradually reduced (in a stepwise manner) from the maximum value Emax to the reference value Ebase in response to the battery degradation integrated value $\Sigma D$.

The reference value Ebase is a value that is set on the assumption that irreversible degradation of the battery 400 due to a high-rate discharge is suppressed. In contrast, the maximum value Emax is a value that is set within the range in which a required battery service life (a usable period that is required of the battery 400, for example, 10 years) can be ensured on the assumption that irreversible degradation of the battery 400 due to a high-rate discharge is permitted.

Before time t1, the battery degradation integrated value $\Sigma D$ is smaller than the permissible value K, so the target value E is set to the maximum value Emax. Thus, the battery degradation evaluation value D becomes smaller than the target value E, so the WOUT limitation is not carried out.

When the battery degradation integrated value $\Sigma D$ reaches the permissible value K at time t1, the target value E begins to be reduced. When the battery degradation evaluation value D exceeds the target value E at time t2, the WOUT limitation is started. As a result, a high-rate discharge is suppressed, and the battery degradation evaluation value D decreases. When the battery degradation evaluation value D becomes smaller than the target value E (reference value Ebase) at time t3, the WOUT limitation begins to be cancelled. When the battery degradation integrated value $\Sigma D$ becomes smaller than the permissible value K at time t4, the target value E is gradually increased again to the maximum value Emax.

In the case where the target value E is fixed, when the battery degradation evaluation value D exceeds this fixed value even once, the limiting condition is satisfied, and the WOUT limitation intervenes. In this case, it is possible to suppress irreversible degradation of the battery 400 due to a high-rate discharge, while the vehicle power performance is impaired. For this reason, until the battery degradation integrated value ED corresponding to the amount of damage accumulated in the battery 400 exceeds the permissible value K, the setting unit 620 raises the target value E to the maximum value Emax larger than the reference value Ebase, and ensures the vehicle power performance by permitting degradation of the battery within the range in which the required battery service life can be ensured.

On the other hand, when the battery degradation integrated value $\Sigma D$ exceeds the permissible value K, the setting unit 620 prompts intervention of the WOUT limitation by reducing the target value E from the maximum value Emax to the reference value Ebase. Thus, it is possible to appropriately ensure the required battery service life by suppressing degradation of the battery 400 due to a high-rate discharge.

As described above, the WOUT limitation intervenes in response to the fact that the battery degradation integrated value $\Sigma D$ exceeds the permissible value K in the vehicle. FIG. 9 shows the waveforms for the WOUT limitation; however, WIN limitation during charging also intervenes in response to the fact that the battery degradation integrated value $\Sigma D$ becomes negative and becomes smaller than a permissible value L (negative value).

In the alternative embodiment, at the time when the battery is replaced with a battery with a high-rate discharge-resistant grade or a battery with a high-rate charge-resistant grade, the performance of the battery is utilized by causing the WOUT limitation or the WIN limitation difficult to intervene through a change of setting such that the permissible value K and the permissible value L are raised. Therefore, in the alternative embodiment to the present embodiment, the processes of S310 to S313 indicated by the dashed line are added to the process of FIG. 7, which is executed by the battery management system.

Referring back to FIG. 7, in S308, after the excessive discharge-resistant grade is informed as the characteristics required of a replacement battery, the process of waiting for completion of replacement of the battery is executed in S310, and, when the replacement completes, the process of S312 is executed. In S312, the battery management ECU 14 outputs a command to the vehicle ECU 600 such that the discharge-side permissible value K stored in the storage unit 652 is rewritten to an increased (raised) value K1. Thus, after replacement of the battery, the vehicle becomes difficult to receive the WOUT limitation as shown in FIG. 9, so the vehicle is able to travel such that a user's request is satisfied.

During charging as well, as in the case during discharging, the permissible value L is set on a negative side as shown in FIG. 9 for the battery degradation integrated value ΣD. When the battery degradation integrated value ΣD becomes smaller than the permissible value L, the WIN limitation is carried out. In S309, after the excessive charge-resistant grade is informed as the characteristics required of a replacement battery, the process of waiting for completion of replacement of the battery is executed in S311, and, when the replacement completes, the process of S313 is executed. In S313, the battery management ECU 14 outputs a command to the vehicle ECU 600 such that the charge-side permissible value L stored in the storage unit 652 is rewritten to the value L1 raised as shown in FIG. 9. Thus, after replacement of the battery, the vehicle becomes difficult to receive the WIN limitation, so the vehicle is able to regenerate electric power or be charged such that a user's request is satisfied.

With the above configuration, the battery management ECU 14 sets the permissible value to a raised value such that the output limitation on the vehicle 100 after replacement of the battery becomes difficult to occur, so the vehicle 100 is able to further exercise the performance.

A model case that fuel economy improves will be described as an example in which the vehicle is able to exercise the performance. FIG. 10 is a table for illustrating an example in which fuel economy improves because of a battery to be used. In FIG. 10, common to the embodiment, a first comparative embodiment and a second comparative embodiment, a user's usage is a usage in which there is a large imbalance toward an excessive charge. At this time, the battery having a grade at which resistance to an excessive charge is high is used in the embodiment, the battery with a general grade is used in the first comparative embodiment, and the battery having a grade at which resistance to an excessive charge is low is used in the second comparative embodiment.

In this alternative embodiment, because the permissible value L is set commensurately with a usage battery, where input/output limitation (WIN limitation) intervening frequency in the embodiment in which the battery is replaced with an optimal battery is 1, input/output limitation occurs at the frequency of 1.5 times in the first comparative embodiment in which a non-optimal battery is used, and input/output limitation occurs at the frequency of 2 times in the second comparative embodiment. This indicates that electric power during regeneration of the motor is more easily recovered in the embodiment than in the first and second comparative embodiments, and indicates that fuel economy improves.

In order to simply measure the imbalance of a user's usage, the occurrence frequency of the input/output limitation of the battery during charging and the occurrence frequency of the input/output limitation of the battery during discharging are separately counted, and it may be determined whether it is an excessive charge or an excessive discharge on the basis of which count value is large.

FIG. 1 shows an example in which the device that uses the battery is a vehicle. Instead, the device does not need to be a vehicle, and the invention is applicable to a device as long as a battery of the device is replaced.

The embodiments described above are illustrative and not restrictive in all respects. The scope of the invention is defined by the appended claims rather than the above description. The scope of the invention is intended to encompass all modifications within the scope of the appended claims and equivalents thereof.

What is claimed is:

1. A battery management terminal for a secondary battery which is configured to be mounted on a device:
   the battery management terminal comprising:
   an electronic control unit configured to:
   acquire historical information of an evaluation value of the secondary battery, the evaluation value being associated with a degradation of the secondary battery due to a charge or a discharge on the basis of an estimated change in an ion concentration imbalance in an electrolyte of the secondary battery on the basis of a history of detected current flowing through the battery;
     perform a first determination of determining whether the secondary battery is reusable on the basis of the historical information, and
   perform a second determination of determining a classification grade of the secondary battery on the basis of an actually measured value resulting from a test performed on an extracted cell of the secondary battery only when the electronic control unit determines that the secondary battery is reusable.

2. The battery management terminal according to claim 1, wherein
   the electronic control unit is configured to determine an imbalance in an occurrence frequency of a charge or an occurrence frequency of a discharge in the device in which the secondary batter is configured to be mounted, on the basis of the historical information of the evaluation value, and
   wherein the battery management terminal further includes an inform unit being configured to inform characteristics of a replacement secondary battery suitable for the imbalance as required characteristics.

3. The battery management terminal according to claim 1, wherein
   the electronic control unit is configured to, when a replacement secondary battery that satisfies required characteristics is installed into the device as a replacement battery, rewrite a stored permissible value to a value larger than the initially stored permissible value, the initially stored permissible value being an integrated value of the evaluation value.

4. The battery management terminal according to claim 1, wherein the battery management terminal further includes an inform unit which is a display.

5. The battery management terminal according to claim 1, wherein
   the device on which the secondary battery is configured to be mounted is a vehicle.

6. A battery management system comprising:
   a device comprising:
   a secondary battery;
   a load which receives an output from the secondary battery; and
   a first electronic control unit configured to detect a current flowing through the secondary battery, estimate a change in an ion concentration imbalance in an electrolyte of the secondary battery on the basis of a history of the detected current, calculate an evaluation value associated with a degradation of the secondary battery due to a charge or a discharge on the basis of an estimated change in the ion concentration imbalance, and store historical information of the evaluation value; and a battery management terminal comprising:

a second electronic control unit configured to, acquire the historical information of the evaluation value of the secondary battery from the first electronic control unit, determine required characteristics required of a replacement secondary battery on the basis of the historical information of the evaluation value, the historical information being acquired from the device; and an inform unit being configured to inform the required characteristics determined by the second electronic control unit, wherein the second electronic control unit is further configured to:

perform a first determination of determining whether the secondary battery is reusable on the basis of the historical information, perform a second determination of determining a classification grade of the secondary battery on the basis of an actually measured value resulting from a test performed on an extracted cell of the secondary battery only when the second electronic control unit determines that the secondary battery is reusable, and record the classification of the grade of the secondary battery in a battery stock database of a battery remanufacturing factory only when the second electronic control unit determines that the secondary battery is reusable.

7. The battery management system according to claim 6, wherein
the device on which the secondary battery is configured to be mounted is a vehicle.

* * * * *